United States Patent [19]

Bartlett

[11] Patent Number: 4,514,580
[45] Date of Patent: Apr. 30, 1985

[54] PARTICULATE SILICON PHOTOVOLTAIC DEVICE AND METHOD OF MAKING

[75] Inventor: Robert W. Bartlett, Tucson, Ariz.

[73] Assignee: SRI International, Menlo Park, Calif.

[21] Appl. No.: 557,443

[22] Filed: Dec. 2, 1983

[51] Int. Cl.³ .................... H01L 31/06; H01L 31/18
[52] U.S. Cl. .................... 136/250; 29/572; 29/588; 136/251
[58] Field of Search ............. 136/250, 258 PC, 259; 29/572, 588

[56] References Cited

U.S. PATENT DOCUMENTS

| | | | |
|---|---|---|---|
| 3,038,952 | 6/1962 | Ralph | 29/572 |
| 3,480,818 | 11/1969 | TeVelde | 136/250 |
| 4,078,944 | 3/1978 | Mlavsky | 136/246 |
| 4,454,372 | 6/1984 | Appleby | 136/250 |

FOREIGN PATENT DOCUMENTS 55-158678 12/1980 Japan .................... 136/250

OTHER PUBLICATIONS

M. B. Prince, "Photovoltaic Conversion 2. Large Area Silicon Solar Cells", *Proceedings, 14th Power Sources Conf.*, (1960), pp. 26-27.

Primary Examiner—Aaron Weisstuch
Attorney, Agent, or Firm—John P. Taylor

[57] ABSTRACT

An inexpensive photovoltaic device made using particulate silicon is described. Silicon particles of a particular type having a size range of from 300 to 1000 micrometers are sintered to a metallic substrate to form an ohmic contact therebetween. The particles and the substrate are provided with an insulating layer except for the top surfaces of the silicon particles, to which a layer of the opposite type is applied to form p-n junctions in the particles. A second electrode is then applied either directly or, preferably, via a first application of a transparent conductive coating. The device is then, preferably, covered with a light transparent member to provide a hermetic seal.

2 Claims, 2 Drawing Figures

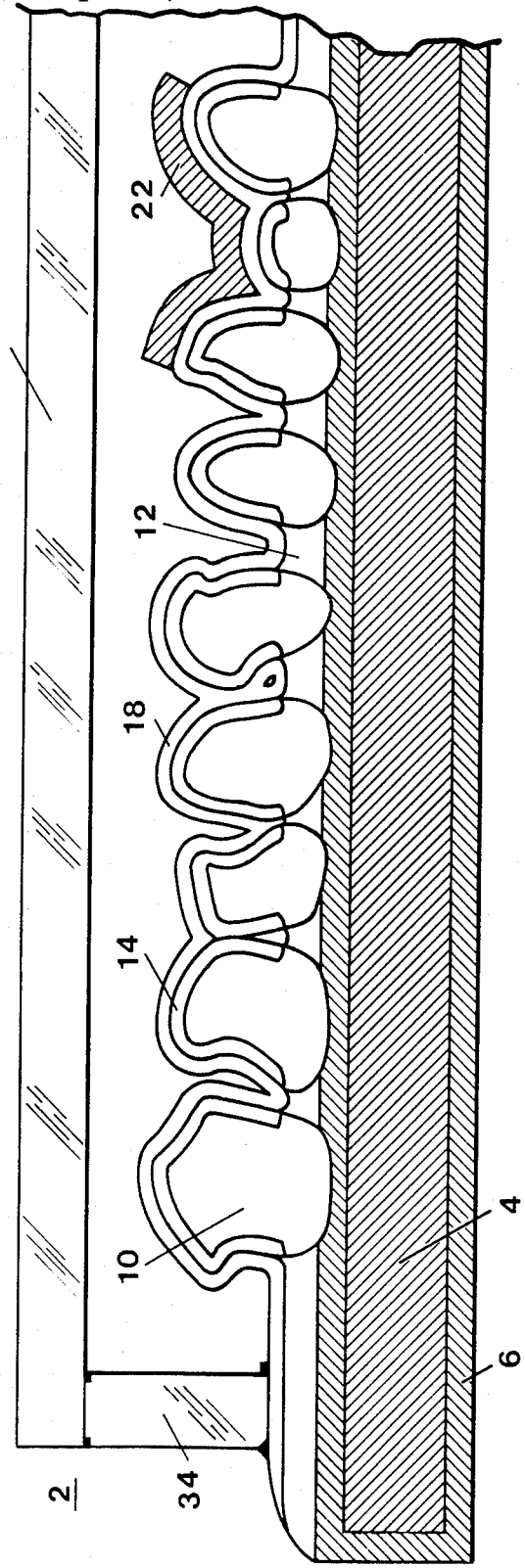

PARTICULATE SILICON PHOTOVOLTAIC DEVICE AND METHOD OF MAKING

BACKGROUND OF THE INVENTION

1. Technical Field of the Invention

This invention relates to a silicon photovoltaic device. More particularly, this invention relates to a silicon photovoltaic device made using particulate silicon which may be polycrystalline.

2. Background Art

The production of photovoltaic devices or solar cells from silicon historically has involved the use of high purity, single crystal silicon which is doped to produce either a p-type or n-type material. The doped crystal is then sliced into discs or wafers and, depending upon the previous doping, either an electron donor or an electron acceptor is diffused into selected regions to form p-n junctions. Electrodes are then applied respectively to the diffused and nondiffused regions.

This technique, while resulting in the production of an acceptable photovoltaic device, is expensive and time-consuming, particularly in the cost of diamond sawing the silicon to produce wafers. Furthermore, the size of the cell is limited by the size of the wafer which is, in turn, limited by the size of the single crystal ingot. While the size may be increased using cast silicon sheet, the costs are commensurately increased by the use of such techniques.

Much attention has, therefore, been directed to the possible use of particulate and/or polycrystalline materials. The use of such materials was earlier investigated in the production of cadmium sulfide solar cells. Tanos U.S. Pat. No. 3,480,473 teaches a method of making an improved photovoltaic cell from polycrystalline cadmium sulfide by etching the surface of a cadmium sulfide film vacuum deposited on a molybdenum substrate. The vacuum deposited cadmium sulfide forms an n-type layer on the substrate. A barrier layer of copper is then applied forming a p-type layer.

Yamashita U.S. Pat. No. 3,615,877 also describes a method of making a photovoltaic cell employing powdered polycrystalline cadmium sulfide. The method involves coating a substrate having an electrode thereon with a composition containing cadmium sulfide and then firing the coated substrate to obtain a sintered film. A metal, such as copper, is electroplated to at least a portion of the surface to convert the surface to p-type thereby forming a p-n junction.

Particulate silicon has also been used to form solar cells. Paradise U.S. Pat. No. 2,904,613 describes the use of 2 mm silicon particles having an electron acceptor material previously diffused a predetermined distance into the entire outer surface of the particle. The particles are coated with an insulator and then applied to a reinforcing plate. The exposed side of the particle layer is then etched until the faces of the crystallites are exposed and the diffused layer removed, thereby exposing "N" silicon. The exposed silicon is then plated with nickel, and solder is then used to sweat a continuous base plate to the negative surface. The reinforcing plate is then removed, thereby exposing the "P" layer to which an electrode is applied using selective etching techniques.

Kilby et al U.S. Pat. No. 4,021,323 also discloses the use of particulate silicon to form a type of solar cell using n-type and p-type spheres which have surface diffusions respectively forming p-n junctions in each sphere. The spheres are coated with a metal layer and then an insulating layer and then pressed onto a wax covered substrate. The spheres and the substrate are then flooded with a layer of insulating compound. The upper surface of the spheres is then etched to expose the cores of the spheres. A thin layer of aluminum is then deposited, followed by a layer of material for strength and protection. The wax covered substrate is then removed from the opposite side of the device, and the insulating layer on the surface of the spheres is removed to expose the top portion of the metal covered spheres. The device is intended for use with an electrolyte wherein generation of photovoltaic current will result in the production of hydrogen which is then stored for future use.

While the foregoing uses of particulate and polycrystalline material undoubtedly represents improvement in the cost of manufacture of solar devices over single crystal devices, there still remains a need for elimination of costly preprocessing, e.g., doping by diffusion, of individual silicon particles prior to their incorporation into an array or device.

SUMMARY OF THE INVENTION

It is, therefore, an object of this invention to provide a silicon solar cell from particulate silicon.

It is another object of this invention to provide a silicon solar cell from particulate silicon which may be polycrystalline.

It is yet another object of the invention to provide a silicon solar cell from particulate silicon wherein the particles need not be individually doped.

It is a further object of the invention to provide a solar cell from particulate silicon which is first doped and then crushed into particulate form.

It is a still further object of the invention to provide a solar cell from particulate silicon wherein the particles are diffusion bonded to a substrate to form an ohmic contact.

These and other objects of the invention will be apparent from the description and accompanying drawings.

In accordance with the invention, a solar cell is provided by sintering silicon particles to a metal surface to provide silicon particles of a first type having an ohmic contact with the substrate. The particles and substrate are then coated with an electrically insulating material, and the surface is etched to expose bare silicon at the upper surface. A layer of silicon of an opposite conductivity type is then formed on the exposed silicon to form p-n junctions, and an electrode is applied to selected portions of the upper surface of the opposite type layer. A light transmitting, protective shield may then be placed over the device.

BRIEF DESCRIPTION OF THE DRAWINGS

FIG. 2 is a fragmentary cross-sectional view of a portion of the device of the invention.

DESCRIPTION OF THE INVENTION

Figure 1:
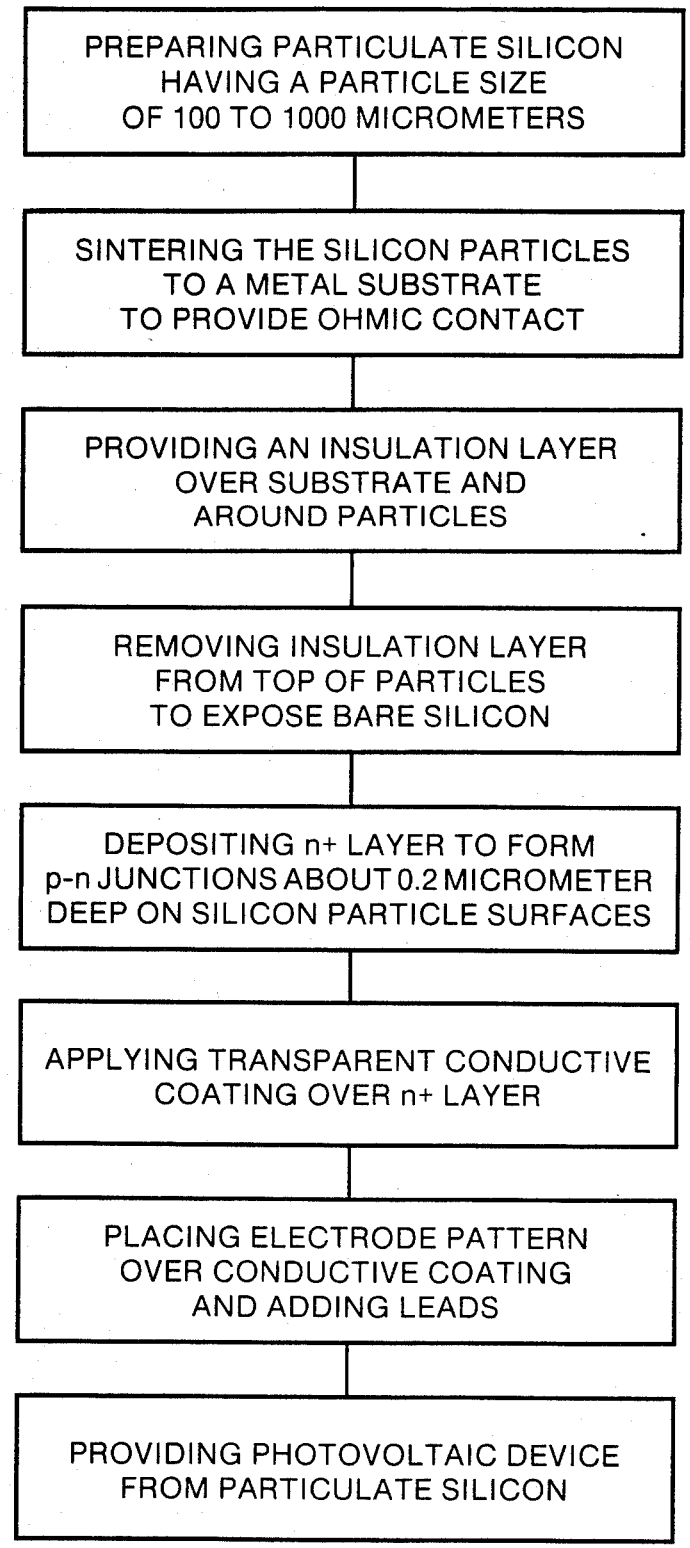
FIG. 1 is a flow sheet illustrating the steps used in forming the photovoltaic device of the invention.

A photovoltaic device is produced, in accordance with the invention, using particulate silicon which may be single crystal or polycrystalline. By the use of particulate silicon, the photovoltaic device is, essentially, not limited to a particular size and may be economically produced.

In accordance with the invention, particulate silicon, useful in the practice of the invention, may be produced by melting solar grade silicon having a resistivity of 1 to 10 ohm centimeters, for example, p-type, and casting it to provide a coarse grain structure of about 1 millimeter or larger. The particles are then crushed and screened to provide a particle size mix of about 0.3 to 1 millimeters.

The resultant silicon particles are then etched to remove any contamination or surface damage by an etchant which may comprise an etching solution of nitric and hydrofluoric acids.

The etched particles are then spread on a metallic substrate to which they will be sintered to form one electrode of the photovoltaic device. In accordance with a preferred embodiment, the substrate comprises a steel plate, chosen for both strength and economics, coated with a layer of aluminum of 100 to 500 micrometers thickness. The silicon particles are sintered to the aluminum coated substrate at a temperature of about 660° C. in a nonoxidizing atmosphere, such as a hydrogen or nitrogen atmosphere, to provide an ohmic contact between the silicon particles and the aluminum coating on the substrate. Any unattached silicon particles may be discarded and recycled for further use.

Optionally, the sintered silicon particles may be oxidized by thermal or steam oxidation at this point to provide a protective oxidation coating on the particles to prevent contamination.

The silicon particle coated substrate is now coated with an insulating material to insulate the particles from one another and to insulate and cover the substrate and adjacent ohmic contacts. The insulating material may comprise a low melting glass, i.e., having a melting point of less than 660° C., or may comprise another insulating material, such as a silicone resin, e.g., a transparent RTV silicone resin available from the General Electric Company.

The top surface is now polished or etched to remove any of the insulating material on the top surface of the silicon particle to expose bare silicon. If the insulating material is a glass material, a nitric acid and hydrofluoric acid etch may be used. Alternatively, if the insulating layer comprises a resin, such as a silicone resin; a solvent, such as a trialkylamine, may be used to remove a sufficient amount to expose the tops of the silicon particles.

An n+ layer with a junction of about 0.2 micrometer depth is now placed over the exposed silicon particles. This can be accomplished by ion implantation, diffusion, epitaxial deposition, or any other known technique.

Optionally, a transparent conductive coating may then be applied to the n+ layer. Tin oxide or indium tin oxide may be applied by plating or sputtering.

Ohmic metal lead contacts are now applied to the surface in any desired pattern as required to distribute current to the surface.

Finally, the device may be provided with a transparent protective layer which may comprise a glaze or insulating resin applied over the device or may comprise a glass cover plate hermetically sealed to the device.

Referring to FIG. 2, a device 2 can be constructed in accordance with the invention in the following way. A steel substrate 4 is covered with an aluminum layer 6 to which is attached by pressure sintering a layer of p-type silicon particles 10 having a particle size range of about 300 to 1000 micrometers. An insulating glaze can be applied by firing at a temperature just under 660° C. for 2 minutes to fill the interstices between the particles 10 and to provide a protective insulating layer 12 over aluminum layer 6. An n+ layer 14 over particles 10 can be formed by ion implantation onto the top surfaces of the silicon particles after first etching with a nitric and hydrofluoric acid mixture to remove the glaze from the top of the silicon particles. A transparent tin oxide conductive coating 18 can be deposited over the n+ layer, and a nickel electrode contact lead 22 can then be screened onto transparent conductive coating 18. In the embodiment illustrated, a glass cover 30 over the device will be hermetically sealed to substrate 4 by a seal member 34 which surrounds the periphery of the device.

Thus, the invention provides a photovoltaic device constructed using particulate silicon which may be polycrystalline, thus reducing the costs considerably by elimination of the need for large single crystal wafers or individually doped particles.

Having thus described the invention, what is claimed is:

1. A hermetically sealed photovoltaic device comprising a substrate having an aluminum surface thereon with crushed p-type nonspherical silicon particles having a particle size range of 300–1000 micrometers sintered thereto to form an ohmic contact with said aluminum surface, an electrically insulating glass having a melting point of under 660° C. covering said crushed silicon particles and the aluminum surface of the interstices between adjacent particles, and n+ region formed in an exposed upper portion of said silicon particles to form p-n junctions in situ within said silicon particles, a transparent conductive coating comprising a tin oxide layer electrically contacting said n+ region, an electrode in ohmic contact with selective portions of said transparent conductive coating, and a transparent protective layer over said conductive layer providing a hermetic seal for said photovoltaic device.

2. A method of making an inexpensive hermetically sealed solar cell device from nonspherical particulate silicon which comprises:
  (a) casting p-type silicon having a resistivity of 1 to 10 ohm centimeters to provide a coarse grain structure of about 1 millimeter or larger;
  (b) crushing and screening said cast p-type silicon to provide a nonspherical particle size mix of about 0.3 to 1 millimeter;
  (c) sintering said crushed silicon particles to an aluminum layer on a substrate at a temperature of about 660° C. in a nonoxidizing atmosphere to provide ohmic contact between said crushed silicon particles and said aluminum layer;
  (d) coating said silicon particle-containing substrate with a low melting glass have a melting point of less than 660° C. and firing said coating at a temperature just under 660° C. for about 2 minutes to fill the interstices between said crushed silicon particles and to form an electrically insulating layer;
  (e) selectively etching the top surface of said coated particles with a nitric acid and hydrofluoric acid etchant mixture to remove insulating material on the top surface of said silicon particles to thereby expose bare silicon on the top of said particles;
  (f) forming an n+ layer of about 0.2 micrometer depth adjacent said exposed top surface of said p-type silicon particles to thereby form p-n junctions in situ in said silicon particles;

(g) depositing a transparent tin oxide conductive layer over said p-n junctions to form an electrical contact thereto;

(h) applying an electrode to selective portions of said conductive layer; and (i) hermetically sealing said solar cell by applying a glass cover plate to said device.

* * * * *